(12) United States Patent
Ito et al.

(10) Patent No.: US 7,968,256 B2
(45) Date of Patent: Jun. 28, 2011

(54) NEAR FIELD EXPOSURE MASK, METHOD OF FORMING RESIST PATTERN USING THE MASK, AND METHOD OF PRODUCING DEVICE

(75) Inventors: Toshiki Ito, Kawasaki (JP); Natsuhiko Mizutani, Tokyo (JP); Akira Terao, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 203 days.

(21) Appl. No.: 12/376,426

(22) PCT Filed: Oct. 5, 2007

(86) PCT No.: PCT/JP2007/070015
§ 371 (c)(1), (2), (4) Date: Feb. 4, 2009

(87) PCT Pub. No.: WO2008/047733
PCT Pub. Date: Apr. 24, 2008

(65) Prior Publication Data
US 2010/0270264 A1   Oct. 28, 2010

(30) Foreign Application Priority Data
Oct. 10, 2006   (JP) .................................. 2006-276052

(51) Int. Cl.
*G03F 1/00* (2006.01)
*G03F 7/00* (2006.01)
(52) U.S. Cl. .......................................... 430/5; 430/322
(58) Field of Classification Search .............. 430/5, 311, 430/322, 394; 378/35
See application file for complete search history.

(56) References Cited

U.S. PATENT DOCUMENTS

| 6,171,730 B1 | 1/2001 | Kuroda et al. |
| 6,444,372 B1 | 9/2002 | McCullough |

(Continued)

FOREIGN PATENT DOCUMENTS
EP   1 096 312   5/2001
(Continued)

OTHER PUBLICATIONS

U.S. Appl. No. 11/913,922, International Filing Date Oct. 10, 2007, Ito, et al.

(Continued)

*Primary Examiner* — Stephen Rosasco
(74) *Attorney, Agent, or Firm* — Fitzpatrick, Cella, Harper & Scinto (57) ABSTRACT

Provided are a near field exposure mask which can suppress heat generation of a mask during exposure and can also suppress variation in size of a resist pattern for each shot, and a resist pattern forming method using the same. The near field exposure mask includes a transparent mask matrix $l_0$; a light shielding layer $l_2$ formed above the transparent mask matrix $l_0$ and containing silicon; a reflective layer $l_1$ formed between the transparent mask matrix $l_0$ and the light shielding layer $l_2$; and an opening pattern provided in the reflective layer $l_1$ and the light shielding layer $l_2$ and being less in size than an exposure wavelength $\lambda$ (nm), wherein the reflectance at an interface between the transparent mask matrix $l_0$ and the reflective layer $l_1$ is higher than a reflectance at an interface between a transparent mask matrix and a light shielding layer formed on the transparent mask matrix and containing silicon of a near field exposure mask which has no reflective layer between the transparent mask matrix and the light shielding layer.

19 Claims, 6 Drawing Sheets

U.S. PATENT DOCUMENTS

| | | | |
|---|---|---|---|
| 6,720,115 B2 * | 4/2004 | Inao et al. | 430/5 |
| 7,547,503 B2 | 6/2009 | Ito et al. | |
| 7,659,039 B2 * | 2/2010 | Ito et al. | 430/5 |
| 2007/0212806 A1 | 9/2007 | Ito | |
| 2007/0218398 A1 | 9/2007 | Ito et al. | |
| 2008/0085479 A1 | 4/2008 | Yamaguchi et al. | |
| 2008/0187864 A1 | 8/2008 | Ito et al. | |
| 2008/0187865 A1 | 8/2008 | Ito et al. | |
| 2009/0208850 A1 | 8/2009 | Ito et al. | |

FOREIGN PATENT DOCUMENTS

| | | |
|---|---|---|
| JP | 7-106229 | 4/1995 |
| JP | 2001-166453 | 6/2001 |

OTHER PUBLICATIONS

PCT International Search Report and Written Opinion of the International Searching Authority in International Application No. PCT/JP2007/070015, Mailing Date Feb. 12, 2008.

M. M. Alkaisi, et al., "Sub-diffraction-limited patterning using evanescent near-field optical lithography", Applied Physics Letters, vol. 75, No. 22, 1999, pp. 3560-3562.

N. Mizutani, et al., "Photomasks with Amorphous Si Absorber for Near-field Mask Lithography", 25a-ZB-1, Extended Abstracts of the 53rd Spring Meeting of Japan, 2005, p. 757.

G. Latini, et al., "Investigation of heating effects in near-field experiments with luminescent organic semiconductors", Synthetic Metals, vol. 147, 2004, pp. 165-169.

* cited by examiner

NEAR FIELD EXPOSURE MASK, METHOD OF FORMING RESIST PATTERN USING THE MASK, AND METHOD OF PRODUCING DEVICE

TECHNICAL FIELD

The present invention relates to a near field exposure mask, a method of forming a resist pattern using the mask, and a method of producing a device.

BACKGROUND ART

Accompanied with the development of high-capacity semiconductor memories and the development of high-speed or highly integrated CPU processors, finer photolithography has become indispensable.

In general, the lower limit of fine processing in a photolithographic apparatus is about one third of the wavelength of a light source used.

Therefore, the shortening of the wavelength of light used for a photolithographic apparatus has been attempted, and it is now possible to perform fine processing of about 50 nm.

Although the finer photolithography has been developed as described above, with the shortening of the wavelength of light used, there have been posed many problems to be solved, such as increase in the size of an exposure apparatus, development of a lens for such a shorter wavelength, costs for the apparatus, and costs for a corresponding resist.

On the other hand, in order to carry out fine processing with a resolution less than the wavelength of used light, a method using near field light has been proposed.

Since the near field photolithography is not restricted by a diffraction limit of light, a spatial resolution which is not more than one third of the wavelength of a light source can be obtained.

In addition, by using a mercury lamp or semiconductor laser as a light source, the light source itself can be reduced in size, thereby enabling reduction in size of the structure of an exposure apparatus as well as reduction in costs.

As an example of such methods using near field light, there is known a method of performing scanning with a probe prepared by sharpening a tip of an optical fiber by wet etching (Japanese Patent Application Laid-Open No. H07-106229).

However, in this method, fine processing is performed in a manner similar to drawing with one stroke by use of one or more processing probes, so that the method has a problem that the throughput needs to be improved.

Therefore, there has been proposed a near field exposure method in which a photomask with a light shielding layer having formed therein an opening which is less in size than the wavelength of a light source is brought into close contact with a resist and one-shot exposure is performed, thereby improving the throughput (Appl. Phys. Lett., 75, 3566 (1999) and U.S. Pat. No. 6,171,730).

In order to form a fine resist pattern using near field light by employment of such a close contact exposure system, it is necessary to use a near field exposure mask with a light shielding layer having an opening pattern which is less in size than the wavelength of exposure light and to bring the near field exposure mask and a resist into close contact with each other.

This is because the intensity distribution of near field light is attenuated rapidly with increasing distance from the fine opening.

By using silicon for a light shielding layer of a near field exposure mask, a large extinction coefficient is obtained and the fine processing by dry etching can be easily performed, thereby enabling formation of a fine light shielding layer pattern.

Hitherto, there has been known a technology of forming a fine resist pattern by transferring a mask pattern by exposure using a near field exposure mask having such a light shielding layer (Extended Abstracts of the 53rd Spring Meeting of Japan Society of Applied Physics, 25a-ZB-1 (2006))

In addition, Japanese Patent Application Laid-Open No. 2001-166453 discloses a technology such that in a projection exposure mask, a reflective layer is provided between a metal light shielding layer and a mask matrix to thereby suppress a thermal strain of the projection exposure mask itself.

Meanwhile, in the near field exposure in which exposure is performed with a mask having a light shielding layer being in close contact with a resist layer, there is posed a problem that heat of the mask resulting from the light shielding layer is transferred to the resist layer, whereby the pattern size varies.

Next, this problem will be described in more detail.

In the near field exposure, a light shielding layer of a mask reflects or absorbs irradiation light, thereby forming a dark portion immediately therebelow.

Here, description will be made by taking, as an example, a case where an i-line (wavelength: 365 nm) of a mercury lamp is used as exposure light, silicon nitride (complex refractive index with respect to i-line: 2.09+0i) is used as a mask matrix, and amorphous silicon (complex refractive index with respect to i-line: 3.90+2.66i) is used as a light shielding layer.

In this case, the reflectance of the exposure light at an interface between the mask matrix and the light shielding layer calculated using the Fresnel's formulas is 21%.

The exposure light which has not been reflected is absorbed by the light shielding layer and is converted into heat.

It is needless to say that the transmittance of the light shielding layer of the photomask is about 0%.

On the other hand, a resist exhibits development contrast mainly through a photoreaction, but it is generally known that the reaction is promoted also by heat.

Particularly, in those resists which cause a reaction using, as a catalyst, an acid generated from a photoacid generator, such as a chemically amplified type resist and a photoinitiated cationic polymerization type resist, the promotion of the reaction due to heat is remarkable.

For that reason, in the near field exposure in which exposure is performed with a mask having a light shielding layer being in close contact with a resist layer, the heat of the mask which has been generated in the light shielding layer is transferred to the resist layer, which varies the reaction rate of the resist depending on the temperature of the mask, whereby a variation is generated in the pattern size for each shot.

At that time, when the reaction rate of the resist according to the temperature of the mask is high, for example, in a case of a line pattern, the line width is small when a positive resist is used, and the line width is large when a negative resist is used.

Such a problem has not been posed in projection exposure and proximity exposure in which a mask and a resist are not brought into contact with each other, and is peculiar to the near field exposure in which exposure is performed with a mask having a light shielding layer being in close contact with a resist layer.

DISCLOSURE OF THE INVENTION

According to the present invention, there is provided a near field exposure mask including:

a transparent mask matrix $l_0$;

a light shielding layer $l_2$ formed above the transparent mask matrix $l_0$ and containing silicon;

a reflective layer $l_1$ formed between the transparent mask matrix $l_0$ and the light shielding layer $l_2$; and an opening pattern provided in the reflective layer $l_1$ and the light shielding layer $l_2$ and being less in size than an exposure wavelength $\lambda$ (nm), wherein the reflectance at an interface between the transparent mask matrix $l_0$ and the reflective layer $l_1$ is higher than a reflectance at an interface between a transparent mask matrix and a light shielding layer formed on the transparent mask matrix and containing silicon of a near field exposure mask which has no reflective layer between the transparent mask matrix and the light shielding layer.

The present invention also provides a method of forming a resist pattern and a method of producing a device.

The method of forming a resist pattern according to the present invention, for performing exposure using a near field exposure mask in a state where the near field exposure mask is in contact with a resist disposed on a substrate to form a pattern in the resist, includes using, as the near field exposure mask, the near field exposure mask according to the present invention.

The method of producing a device according to the present invention includes etching a substrate by using, as a mask, the resist pattern formed on a substrate by the method of forming a resist pattern according to the present invention.

According to the present invention, it is possible to realize a near field exposure mask which can suppress heat generation of a mask during exposure and can suppress variation in size of a resist pattern for each shot, and a method of forming a resist pattern using the mask.

Further features of the present invention will become apparent from the following description of exemplary embodiments with reference to the attached drawings.

BEST MODE FOR CARRYING OUT THE INVENTION

Hereinafter, an embodiment of the present invention will be described.

The near field exposure mask of the present invention includes a transparent mask matrix $l_0$, a light shielding layer $l_2$ which is formed above the transparent matrix and contains silicon, and a reflective layer $l_1$ formed between the transparent mask matrix and the light shielding layer. An opening pattern which is less in size than an exposure wavelength $\lambda$ (nm) is formed in the reflective layer and the light shielding layer $l_2$.

The near field exposure mask of the present invention is characterized in that a reflectance at an interface between the transparent mask matrix $l_0$ and the light shielding layer $l_1$ is higher than a reflectance at an interface between a transparent mask matrix and a light shielding layer which is formed above the transparent mask matrix and contains silicon of a near field exposure mask having no reflective layer between the transparent mask matrix and the light shielding layer.

When it is assumed that a complex refractive index of the material of the reflective layer is represented by $(n_1+ik_1)$ and the thickness of the reflective layer is represented by d (nm), the present invention includes that these values are set so as to satisfy the following equation (1).

That is:

$$\left| \rho_{2,1} + \frac{t^2 t_{1,2} t_{2,1} \rho_{1,0} \exp(i\gamma)}{1 - t^2 \rho_{1,0} \rho_{1,2} \exp(i\gamma)} \right|^2 > \left| \frac{Y_2 - Y_0}{Y_2 + Y_0} \right|^2 \quad (1)$$

wherein m and n are each a suffix of one of 0, 1, and 2, and $Y_m$=(complex refractive index of $l_m$ layer)=$n_m+ik_m$, $\rho_{m,n}$=$(Y_m-Y_n)/(Y_m+Y_n)$, $t_{m,n}$=$2(Y_m Y_n)^{0.5}/(Y_m+Y_n)$, $t$=$\exp[(-2\pi k_1/\lambda) d]$, and $\gamma$=$(-2\pi n_1/\lambda)d$ are established.

In a case of performing near field exposure using silicon for the light shielding layer, in order to suppress variation in pattern size for each shot, it is necessary to use, as a near field exposure mask, a mask which generates less heat during the exposure.

In view of the above-mentioned circumstances, the present inventors have conducted extensive study and have found a novel structure which can suppress heat generation of a mask caused by a light shielding layer during exposure by providing a reflective layer between a silicon light shielding layer and a mask matrix of a near field exposure mask.

Incidentally, as described above, with regard to the projection exposure mask, there is known a technology of forming a reflective layer between a metal light shielding layer and a mask matrix such as disclosed in Japanese Patent Application Laid-Open No. 2001-166453.

However, the technology is employed to suppress a thermal strain of the mask itself, but is not employed to solve the above-mentioned problem that heat generated in a light shielding layer of a mask is transferred to a resist layer, which causes variation in pattern size.

Hereinafter, the near field exposure mask of the present invention will be described in more detail.

Figure 1:
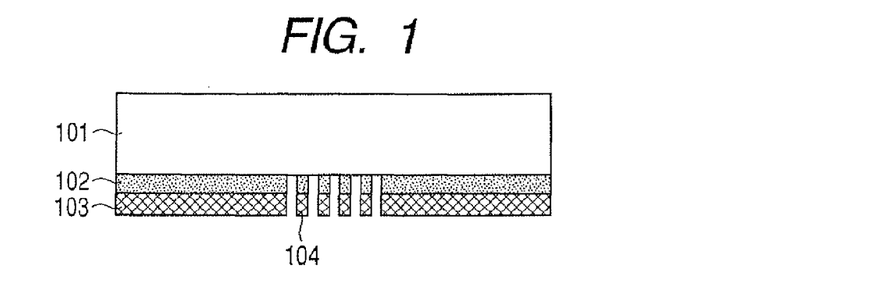
FIG. 1 is a view illustrating a basic structure of a near field exposure mask having a reflective layer according to an embodiment of the present invention.

FIG. 1 is a view illustrating a basic structure of a near field exposure mask having a reflective layer formed therein according to an embodiment of the present invention.

The near field exposure mask according to the present embodiment includes a mask matrix 101, a reflective layer 102, a light shielding layer 103, and a fine pattern 104 which includes at least one opening having a width which is less in size than the wavelength of exposure light.

The fine pattern 104 is formed such that both the reflective layer 102 and the light shielding layer 103 are penetrated so as to expose the mask matrix.

In the near field exposure mask having the structure illustrated in FIG. 1, the reflectance R of light, which is made incident perpendicularly to the mask from the mask matrix side in a region where the fine pattern is not formed, and which is reflected from the interface between the mask matrix and the reflective layer, is represented by the following equation (2) which is obtained by Fresnel's formulas.

$$R = \left| \rho_{2,1} + \frac{t^2 t_{1,2} t_{2,1} \rho_{1,0} \exp(i\gamma)}{1 - t^2 \rho_{1,0} \rho_{1,2} \exp(i\gamma)} \right|^2 \quad (2)$$

Incidentally, it is to be noted that the film thickness of the light shielding layer is described later, and light reflected at an interface between the light shielding layer and the resist is not taken into consideration in the above equation, assuming that almost the entire reflected light is absorbed in the light shielding layer.

On the other hand, a reflectance R' of an interface between the mask matrix and the resist in the case of a near field exposure mask having no reflective layer provided therein is represented by the following equation (3).

$$R' = \left| \frac{Y_2 - Y_0}{Y_2 + Y_0} \right|^2 \quad (3)$$

Here, in a case where the relationship of R>R' is established, the energy of light incident on an inner side of the reflective layer and on an inner side of the light shielding layer is less than that in the case where the reflective layer is not provided.

The incident light which has not been reflected and is incident on the layers is absorbed or transmits, but the transmittance of the reflective layer and the light shielding layer serving as a photomask is almost 0.

Specifically, the sum of the reflectance and the absorptance may be 1, and it can be said that when the reflectance becomes higher, the absorptance becomes lower.

As the light absorptance becomes smaller, the heat generated when light is converted into heat becomes less, so that the influence of the resist on the reaction rate is small.

It is believed that the above also applies to the reflectance and the absorptance obtained for the region where the fine pattern is formed.

As the mask matrix, a material can be used which is transparent with respect to an exposure wavelength, such as silicon nitride, silicone rubber, a synthetic resin, spin-on-glass, and quartz.

Silicone rubber, a synthetic resin, or the like is transparent with respect to exposure light and has a low degree of elasticity, so that the property of the mask of following the waviness of a resist substrate is high. Accordingly, silicone rubber, a synthetic resin, or the like is particularly desirable as the mask matrix for the near field exposure which is close contact exposure.

The thickness of the mask matrix is not particularly limited, but is desirably 0.1 μm to 1000 μm, or more desirably 20 μm to 300 μm. In a case where the thickness is extremely small, the mechanical strength of the mask is small, and in a case where the thickness is extremely large, the transparency with respect to the exposure light is small.

Examples of silicone rubber include polydimethylsiloxane (PDMS). PDMS is transparent at a wavelength of 250 nm or more.

Specific examples of PDMS include Sylgard 182, 184, and 186 which are manufactured by Dow Corning Company and are commercially available with the registered trade mark of Sylgard.

Examples of the synthetic resin include: polyolefin such as polyethylene, polypropylene, cyclic polyolefin, and polyvinyl chloride; and a polyester resin such as polyethylene terephthalat, polybutylene terephthalate, and polyethylene naphthalate.

In addition to the above, known materials such as a plastic film or sheet of an acrylic resin such as polymethylmethacrylic acid, polystyrene/polycarbonate, polyimide, or the like can be used.

From the viewpoints of transparency, heat resistance, chemical resistance, and the like, cyclic polyolefin, polyethylene terephthalate, polycarbonate, and polymethylmethacrylic acid can be desirably used.

More specifically, ARTON manufactured by JSR Corporation, ZEONOR® and ZEONEX® manufactured by ZEON Corporation (which are cyclic polyolefin) and Lumirror® produced by Torey Industries, Inc. can be desirably used.

Alternatively, Teijin® Tetron® Film (which is polyethylene terephthalate) manufactured by Teijin DuPont Films Japan Limited and Panlite® (which is polycarbonate) manufactured by TEIJIN CHEMICALS LTD can be desirably used.

The light shielding layer may contain metal or the like. In this case, by changing the compositional ratio thereof, the optical constant of the light shielding layer can be arbitrarily changed.

The content of silicon atoms of a film constituting the light shielding layer which is adopted for the mask of the present embodiment is set desirably within a range of 0.5 or more and 1.0 or less in terms of molar fraction, and more desirably within a range of 0.9 or more and 1.0 or less.

When the content is less than 0.5 in molar fraction, it is difficult to process the light shielding layer by dry etching. Amorphous silicon, polysilicon, and single-crystal silicon which contain silicon in a molar fraction of 1.0 are particularly desirably used.

Examples of a method of forming the silicon light shielding layer include sputtering, electron beam evaporation, resistive heating evaporation, and low pressure chemical vapor deposition (LPCVD).

When the obtained silicon is amorphous silicon, annealing may be performed using heat or a laser beam to crystallize the silicon.

With regard to the film thickness of the light shielding layer, it is desirable to adjust at least one of the film thickness and the extinction coefficient so that the transmittance with respect to the exposure wavelength is 0.1 or less, desirably 0.01 or less.

When the transmittance is more than 0.1, the light intensity contrast between an exposed portion and an unexposed portion is low, so that a resist pattern with a high resolution is not formed. The extinction coefficient can be adjusted by changing the film forming conditions, adding the above-mentioned metal, or the like.

The transmittance T of a light shielding layer having an extinction coefficient of $k_2$ and a film thickness of $t_a$ with respect to an exposure wavelength λ can be calculated by the following equation (4).

$$T = \exp(-4\pi k_2 t_a / \lambda) \quad (4)$$

For example, the transmittance of a light shielding layer having a thickness of 50 nm with respect to an i-line is 0.1 or less in a case where an attenuation coefficient k is 1.338 or more, and is 0.01 or less in a case where the attenuation coefficient k is 2.675 or more.

The extinction coefficient of each of amorphous silicon, polysilicon, and single-crystal silicon with respect to the i-line is about 2.6 to 2.8.

At this time, the film thickness of the light shielding layer is desirably set to, for example, 10 to 100 nm, and particularly desirably 30 to 70 nm.

When the thickness is extremely small, the light shielding property is small, and when the thickness is extremely large, it is difficult to process a fine pattern by dry etching.

It is preferred that the reflective layer has a material and a film thickness which satisfy the above equation (1).

It is desirable to use, as the material, a metal element or a semiconductor element, or a mixture of two or more kinds of the elements.

However, three kinds of metals, that is, aluminum (complex refractive index respect to i-line: 0.41+4.43i), silver (complex refractive index with respect to i-line: 0.19+1.61i), and chromium (complex refractive index with respect to i-line: 1.40+3.26i), have high reflectance with respect to the i-line and are desirably used.

In a case where the adhesion between the mask matrix and the reflective layer is small, a film may be formed as an underlying layer between the both layers by using another material.

Further, the reflective layer may be formed of a plurality of layers.

Figure 2:
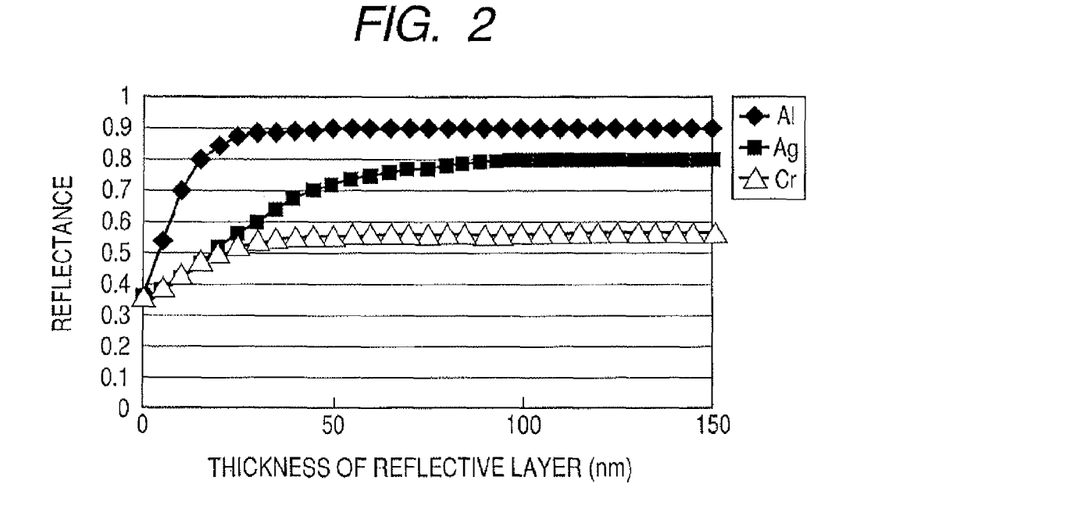
FIG. 2 is a graphical representation illustrating a relationship between film thickness and reflectance of a reflective layer of a near field exposure mask according to an embodiment of the present invention.

FIG. 2 illustrates a relationship between the film thickness of a reflective layer in a case where the above-mentioned three kinds of materials are used for the reflective layer, and the reflectance calculated using the above equation (1), in the near field exposure mask according to the present embodiment in which the mask matrix is made of quartz and the light shielding layer is made of amorphous silicon.

It can be seen that the above-mentioned three kinds of materials each show, in an arbitrary thickness larger than 0 nm, a reflectance which is higher than 0.36 (36%) in the case where the reflective layer is not provided (i.e., the reflective layer having a thickness of 0 nm).

Particularly, in the case of aluminum, the reflectance is 0.9 (90%) at maximum.

That is, while the energy absorbed in the near field exposure mask having no reflective layer is 64%, the energy absorbed in the mask according to the present embodiment is 10%.

In the present embodiment, the amount of heat generation of the mask resulting from the exposure is expected to be reduced in accordance with the reduction of the absorbed light energy.

For this reason, the temperature of the near field exposure mask according to the present embodiment during the exposure is stabilized.

In the present embodiment, it has become apparent that the particularly desirable film thickness of the reflective layer is 30 nm or more for aluminum, 90 nm or more for silver, and 40 nm or more for chromium.

However, in the present invention, the material is not limited to aluminum, silver, and chromium as long as a material and a film thickness are adopted so as to satisfy the above equation (1).

Incidentally, there are cases, depending on the material, where the reflectance becomes lower than that of the case where the reflective layer is not provided, depending on the film thickness, so that it is necessary to set the film thickness with caution based on the above equation (1).

Figure 3:
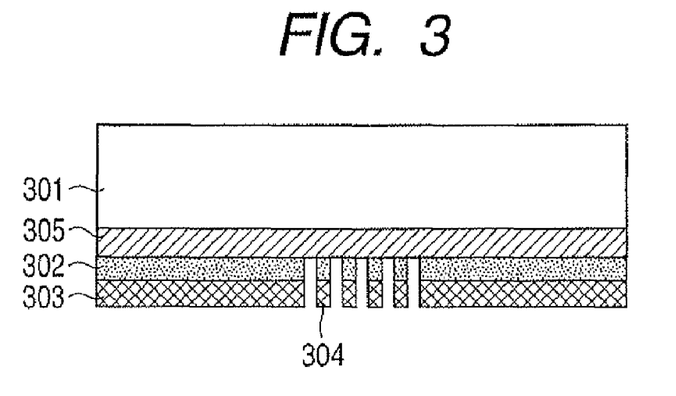
FIG. 3 is a view illustrating a structural example of a near field exposure mask according to the present invention, in which an intermediate matrix is stacked between a mask matrix and a reflective layer.

As illustrated in FIG. 3, an intermediate matrix 305 serving as an intermediate layer may be provided between a mask matrix 301 and a reflective layer 302. When a transparent material such as quartz or spin-on-glass having a refractive index of about 1.5 is stacked as the intermediate layer 305, the reflectance becomes higher as is seen from calculation using the above equation (2).

Accordingly, it is more desirable to employ a structure in which an intermediate matrix is stacked between a mask matrix and a reflective layer.

The thickness of the intermediate matrix 305 is not particularly limited, but is desirably 5 to 5000 nm, more desirably 10 to 1000 nm, or particularly desirably 20 to 500 nm.

When the thickness is extremely small, the effect of increasing the reflectance becomes small, and when the thickness is extremely large, the property of the mask of following the waviness of a to-be-exposed substrate when the mask is brought into contact with the to-be-exposed substrate becomes low. Therefore, the thickness of the intermediate matrix 305 is desirably set within the above-mentioned range.

EXAMPLE 1

As Example 1 of the present invention, a near field exposure mask to which the present invention is applied, and a method of producing the same will be described.

Figure 4A:
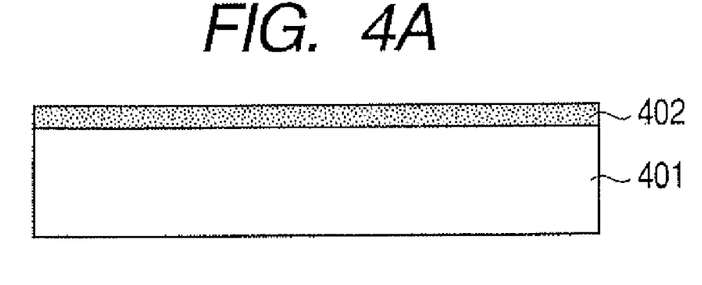
FIGS. 4A, 4B, and 4C are views illustrating a method of producing a near field exposure mask according to Example 1 of the present invention.
Figure 4B:
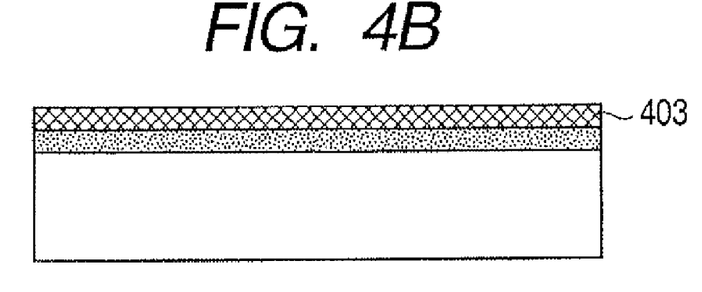
Figure 4C:
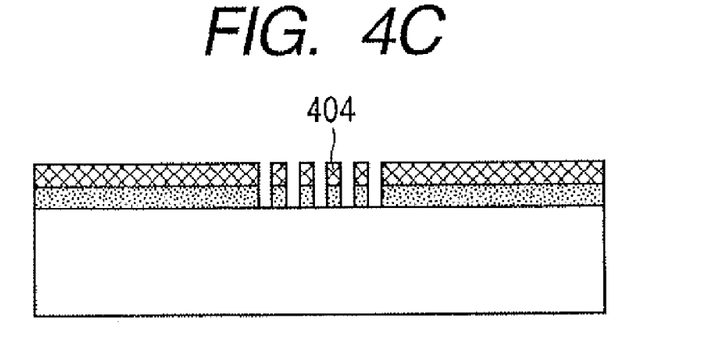

FIGS. 4A, 4B, and 4C each illustrate a method of producing the near field exposure mask of the present example.

In the production of the near field exposure mask, first, a reflective layer 402 made of aluminum or the like is formed on a mask matrix 401 made of a synthetic resin or the like, in a film thickness obtained from the above equation (1) (FIG. 4A).

Examples of the film forming method include sputtering, electron beam evaporation, resistive heating evaporation, and low pressure chemical vapor deposition (LPCVD).

Next, a light shielding layer 403 made of a-Si or the like is formed on the reflective layer 402 (FIG. 4B).

Examples of the film forming method include sputtering, electron beam evaporation, resistive heating evaporation, and low pressure chemical vapor deposition (LPCVD).

Then, a fine pattern 404 is formed on the light shielding layer 403 and the reflective layer 402 (FIG. 4C).

Patterning for forming the fine pattern 404 is performed by direct processing using a focused ion beam (FIB) processing apparatus or by etching processing using, as a mask, a resist which is patterned using an electron beam (EB) lithography apparatus.

In this example, the width of the opening of the fine pattern 404 is set to be less than a wavelength of an exposure light source used for near field exposure.

In the etching processing using the EB lithographic apparatus, an EB resist is directly applied onto the light shielding layer 403 or a hard mask layer such as an oxide layer or a metal layer is formed on the light shielding layer 403 and then the EB resist is applied thereon.

At that time, etching of the hard mask layer, the light shielding layer 403, and the reflective layer 402 may be performed by either dry etching or wet etching.

Dry etching is performed using a gas such as $CF_4$, $C_2F_6$, $C_3F_8$, $CCl_2F_2$, $CCl_4$, $CBrF_3$, $BCl_3$, $PCl_3$, $SF_6$, $Cl_2$, $HCl$, or $HBr$. Wet etching is performed using an aqueous alkaline solution such as potassium hydroxide or tetramethyl ammonium hydroxide.

In the dry etching, a vertical, fine opening pattern can be obtained and is particularly desirably used in the present example.

As described above, as illustrated in FIG. 1, it is possible to obtain the near field exposure mask in which the fine pattern 104 is formed such that both the reflective layer 102 and the light shielding layer 103 are penetrated so as to expose the mask matrix, and the reflective layer 102 is formed between the silicon light shielding layer 103 and the mask matrix 101.

By using the near field exposure mask of the present example for the near field exposure, it is possible to suppress heat generation of the mask caused by the light shielding layer during the exposure and also to suppress variation in resist pattern size for each shot.

EXAMPLE 2

As Example 2 of the present invention, a near field exposure mask having a structure in which an intermediate matrix is stacked between a mask matrix and a reflective layer, and a method of producing the same will be described.

FIGS. 5A, 5B, 5C, and 5D each illustrate the method of producing a near field exposure mask of the present example.

Figure 5A:
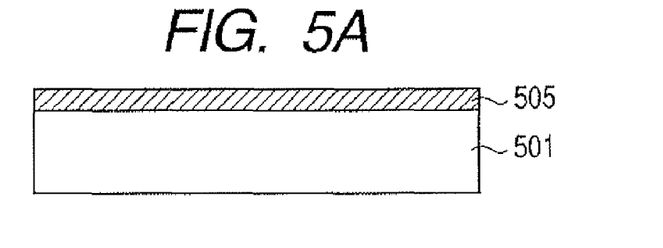
FIGS. 5A, 5B, 5C, and 5D are views illustrating a method of producing a near field exposure mask according to Example 2 of the present invention.
Figure 5B:
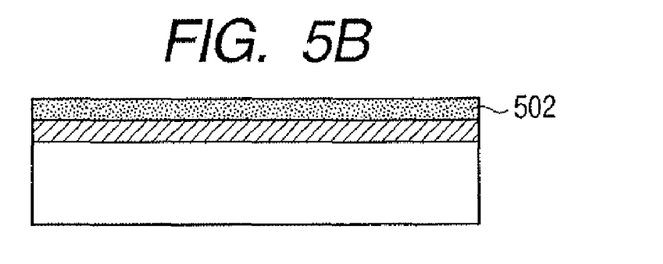
Figure 5C:
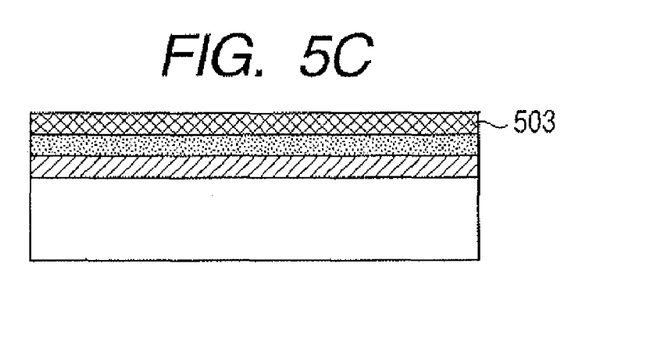
Figure 5D:
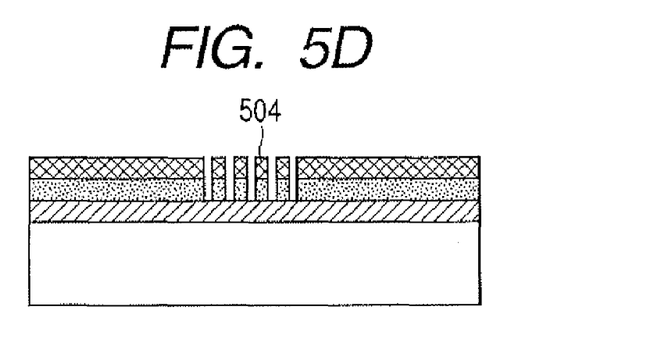

In the production of the near field exposure mask, first, an intermediate matrix 505 made of quartz or the like is formed on a mask matrix 501 made of a synthetic resin or the like (FIG. 5A).

Examples of the film forming method, in the case of quartz or $Si_3N_4$, include sputtering, electron beam evaporation, resistive heating evaporation, and LPCVD.

In the case of using spin-on-glass, film formation is performed by spin coating, spray coating, vapor deposition, dipping, or the like, and then heat curing is performed with a hot plate or an oven.

Film formation of a reflective layer 502 (FIG. 5B), film formation of a light shielding layer 503 (FIG. 5C), and formation of a fine pattern 504 (FIG. 5D) are performed by following the same procedure as in Example 1.

As a result, it is possible to obtain the near field exposure mask having the intermediate matrix 505 stacked between the mask matrix 501 and the reflective layer 502 and having the light shielding layer 503.

By using the near field exposure mask of the present example for the near field exposure, the reflectance is further increased, the heat generation of the mask caused by the light shielding layer during the exposure can be further suppressed, and the variation in resist pattern size for each shot can be further suppressed.

EXAMPLE 3

As Example 3 of the present invention, a near field exposure method using a near field exposure mask according to the present invention will be described. FIGS. 6A, 6B, 6C, and 6D each illustrate the near field exposure method of the present example.

Figure 6A:
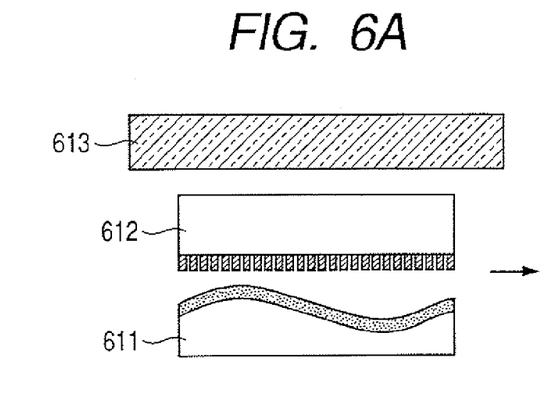
FIGS. 6A, 6B, 6C, and 6D are views illustrating a near field exposure method according to Example 3 of the present invention.

When performing near field exposure, first, a rigid body which is transparent with respect to exposure light is disposed on a mask matrix side of a near field exposure mask 612 in which a synthetic resin is used for a mask matrix.

Incidentally, although a quartz glass 613 is used in the present example, the rigid body is not limited thereto.

A substrate 611 for exposure 611 on which a resist is coated is disposed on a light shielding film side of the near field exposure mask 612.

At this time, any one of a positive resist and a negative resist can be used as long as it has photosensitivity with respect to a light source used.

Examples of the positive resist include a diazonaphthoquinone-novolac type resist and a chemically amplified type resist (positive type) which exhibits development contrast by reaction with an acid being used as a catalyst.

Examples of the negative resist include a chemically amplified type negative resist, a photoinitiated cationic polymerization type resist, a photo-radical polymerization type resist, a polyhydroxystyrene-bisazido type resin, a cyclized rubber-bisazido type resin, and a polyvinylcinnamate type resist. The chemically amplified type positive resist and the chemically amplified type negative resist are particularly desirably used in the present invention because a pattern with a small line edge roughness is to be formed.

Figure 6B:
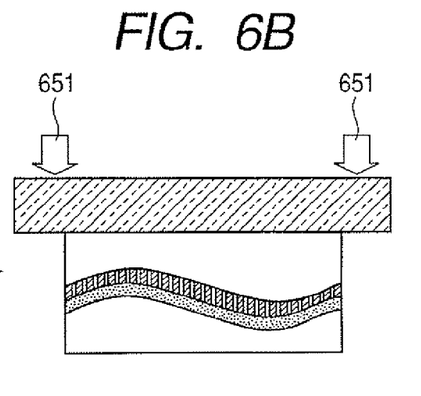

Next, a load 651 is applied while paying attention so as not to shield exposure light 652 (FIG. 6B).

A synthetic resin generally has a high flexibility and can therefore follow waviness of a surface of a to-be-exposed substrate and is brought into close contact with the surface over a large area while being locally deformed.

The waviness of the to-be-exposed substrate results from the flatness of a wafer substrate which is about 1000 nm in a case of a silicon wafer with a diameter of 300 mm, or non-uniformity of film thickness of a resist.

In FIGS. 6A, 6B, 6C, and 6D, the waviness of the to-be-exposed substrate is illustrated in an exaggerated manner.

Further, although in the present example, a load application mechanism is illustrated as a mechanism for bringing the near field exposure mask and the to-be-exposed substrate into close contact with each other, an air pressure or fluid pressure may be used.

Figure 7:
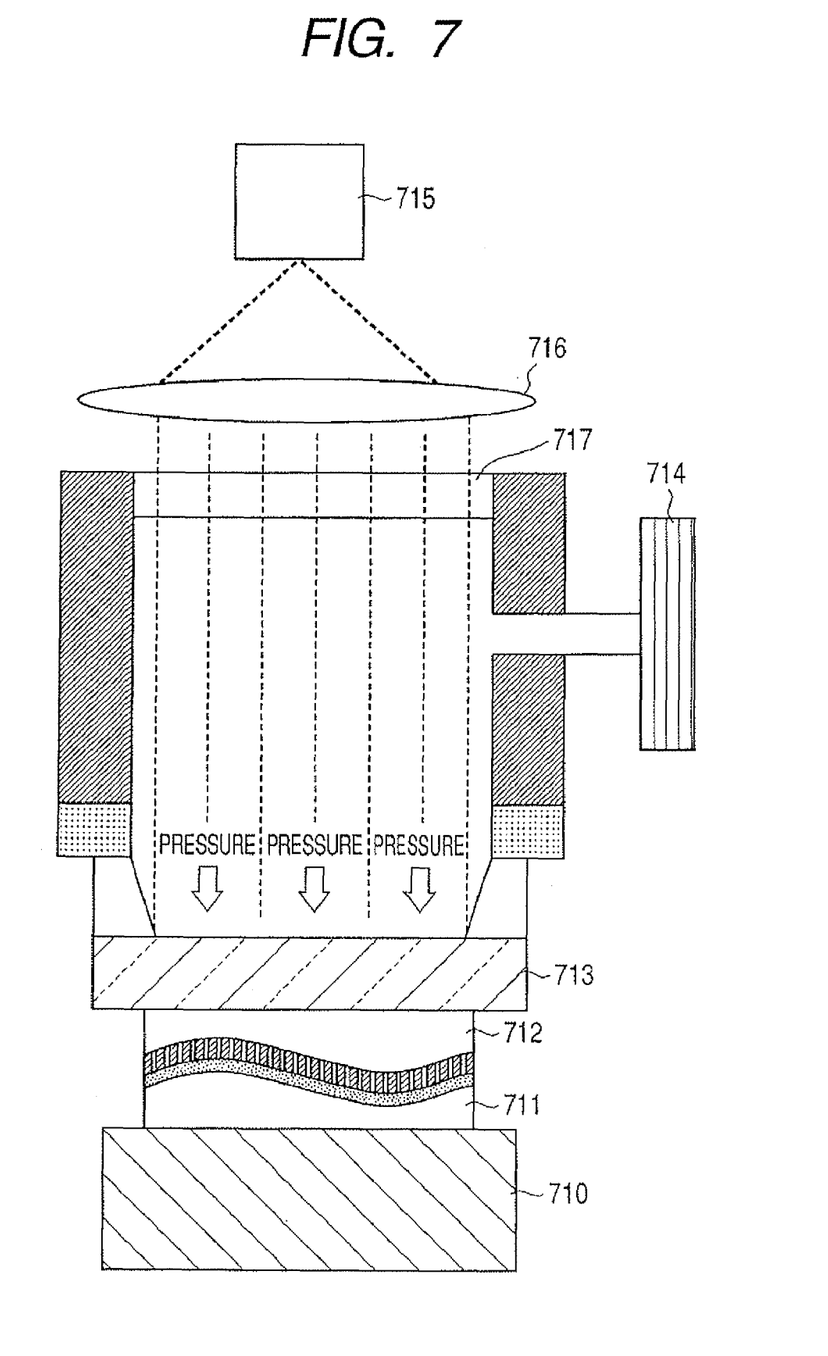
FIG. 7 is a diagram illustrating a near field exposure apparatus used for the near field exposure method according to Example 3 of the present invention.

At that time, a near field exposure apparatus such as illustrated in FIG. 7 can be used.

As illustrated in FIG. 7, the near field exposure apparatus includes a stage 710, a to-be-exposed substrate 711, a near field exposure mask 712, a transparent rigid body 713, a pressure regulating mechanism 714, an exposure light source 715, an illumination optical system 716, and a glass window 717.

The mechanism illustrated in FIG. 7 is basically the same as that illustrated in FIGS. 6A, 6B, 6C, and 6D, with the exception that, as the mechanism for bringing the near field exposure mask and the to-be-exposed substrate into close contact with each other, instead of using the load application mechanism illustrated in FIG. 6B, there is employed a structure for applying a pressure to the near field exposure mask 712 by the pressure regulating mechanism 714.

Figure 6C:
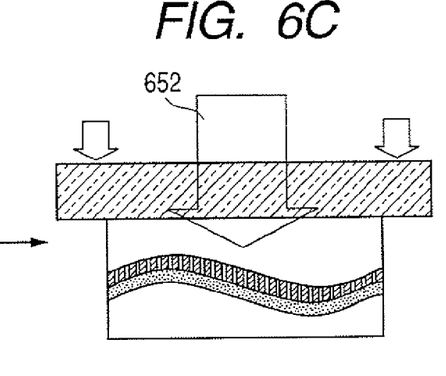

The exposure is performed in a state (contact state) where the near field exposure mask and the to-be-exposed substrate (semiconductor substrate having a resist disposed thereon) are satisfactorily in close contact with each other in a region in which a pattern is to be formed (FIG. 6C).

As the exposure light source (see exposure light source 715 of FIG. 7) for the near field exposure, there is used a known light source such as a carbon arc lamp, a mercury vapor arc lamp, a high pressure mercury vapor lamp, or a xenon lamp.

Alternatively, YAG laser, Ar ion laser, semiconductor laser, F2 excimer laser, ArF excimer laser, KrF excimer laser, visible light, or the like can be used.

One or a plurality of those light sources can be used. In the present invention, light having a wavelength of 365 nm or less can be particularly desirably used.

This is because silicon has a high extinction coefficient with respect to a wavelength less than 365 nm. Near field light is generated from the opening of the light shielding film of the near field exposure mask by the exposure, whereby a latent image of a pattern 614 is transferred into the resist on the to-be-exposed substrate.

Figure 6D:
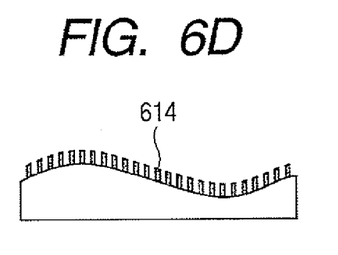

The substrate subjected to the near field exposure is heated as needed and then developed with an aqueous alkaline solution, a water-based developer, or an organic solvent (FIG. 6D).

Examples of the development method include a dipping method, a spraying method, brushing, and slapping. With those methods, a near field resist pattern is formed.

As described above, a resist pattern can be formed by using the near field exposure mask of the present invention as a mask for near field exposure.

Further, by using, as a mask, a resist pattern formed on a substrate (to-be-exposed substrate) by the method of forming a resist pattern according to the present invention, a substrate can be etched to enable a device to be produced on the substrate.

In the case of using a near field exposure mask having no reflective layer according to the background art, even when exposure is performed at the same illuminance and for the same exposure time, the reaction rate of a resist will vary depending on the temperature of the mask, so that the line width of a line pattern and the diameter of a dot/hole pattern vary.

To the contrary, with the near field exposure method of the above-mentioned examples, heat generation can be further suppressed as compared to the near field exposure masks of the background art, so that the temperature of the mask is stabilized, thereby enabling suppression of variation in the resist pattern size.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-276052, filed Oct. 10, 2006, which is hereby incorporated by reference herein in its entirety.

The invention claimed is:

1. A near field exposure mask comprising:
a transparent mask matrix $l_0$;
a light shielding layer $l_2$ formed above the transparent mask matrix $l_0$ and containing silicon;
a reflective layer $l_1$ formed between the transparent mask matrix $l_0$ and the light shielding layer $l_2$; and
an opening pattern provided in the reflective layer $l_1$ and the light shielding layer $l_2$ and being less in size than an exposure wavelength $\lambda$ (nm),
wherein the reflectance at an interface between the transparent mask matrix $l_0$ and the reflective layer $l_1$ is higher than a reflectance at an interface between a transparent mask matrix and a light shielding layer formed on the transparent mask matrix and containing silicon of a near field exposure mask which has no reflective layer between the transparent mask matrix and the light shielding layer.

2. The near field exposure mask according to claim 1, wherein when it is assumed that a complex refractive index of a material of the reflective layer is represented by $(n_1+ik_1)$ and a thickness of the reflective layer is represented by d (nm), these values are set so as to satisfy the following equation (1):

$$\left| \rho_{2,1} + \frac{t^2 t_{1,2} t_{2,1} \rho_{1,0} \exp(i\gamma)}{1 - t^2 \rho_{1,0} \rho_{1,2} \exp(i\gamma)} \right|^2 > \left| \frac{Y_2 - Y_0}{Y_2 + Y_0} \right|^2 \quad (1)$$

wherein m and n are each a suffix which is any one of 0, 1, and 2, and Ym=(complex refractive index of $l_m$ layer)=$n_m+ik_m$, $\rho_{m,n}=(Y_m-Y_n)/(Y_m+Y_n)$, $t_{m,n}=2(Y_mY_n)0.5/(Y_m+Y_n)$, $t=\exp[(-2\pi k_1\lambda)d]$, and $\gamma=(-2\pi n_1/\lambda)d$ are established.

3. The near field exposure mask according to claim 1, wherein in the near field exposure mask comprising the reflective layer $l_1$, the light shielding layer $l_2$ contains silicon in a molar fraction within a range of 0.5 or more and 1.0 or less.

4. The near field exposure mask according to claim 1, wherein the reflective layer $l_1$ is constituted of a plurality of layers.

5. The near field exposure mask according to claim 1, wherein the reflective layer $l_1$ comprises aluminum.

6. The near field exposure mask according to claim 1, wherein the reflective layer $l_1$ comprises silver.

7. The near field exposure mask according to claim 1, wherein the reflective layer $l_1$ comprises chromium.

8. The near field exposure mask according to claim 1, wherein the transparent mask matrix $l_0$ comprises silicon nitride.

9. The near field exposure mask according to claim 1, wherein the transparent mask matrix $l_0$ comprises silicone rubber.

10. The near field exposure mask according to claim 1, wherein the transparent mask matrix $l_0$ comprises a synthetic resin.

11. The near field exposure mask according to claim 1, wherein the transparent mask matrix $l_0$ comprises spin-on-glass.

12. The near field exposure mask according to claim 1, wherein the transparent mask matrix $l_0$ comprises quartz.

13. The near field exposure mask according to claim 1, further comprising an intermediate layer provided between the transparent mask matrix $l_0$ and the reflective layer $l_1$.

14. The near field exposure mask according to claim 13, wherein the intermediate layer comprises quartz or spin-on-glass.

15. A method of forming a resist pattern, for performing exposure using a near field exposure mask in a state where the near field exposure mask is in contact with a resist disposed on a substrate to form a pattern in the resist, which comprises using, as the near field exposure mask, the near field exposure mask set forth in claim 1.

16. The method according to claim 15, comprising using, as the resist, a resist which exhibits a development contrast through a reaction using an acid generated by the contact exposure as a catalyst.

17. The method according to claim 16, wherein the resist is a chemically amplified type resist.

18. The method according to claim 16, wherein the resist is a photoinitiated cationic polymerization type resist.

19. A method of producing a device, comprising etching a substrate by using, as a mask, the resist pattern formed on a substrate by the method of forming a resist pattern set forth in claim 15 to produce a device on the substrate.

* * * * *